US008711532B2

(12) United States Patent
Pfennigstorf et al.

(10) Patent No.: US 8,711,532 B2
(45) Date of Patent: Apr. 29, 2014

(54) INTEGRATED ADVANCE COPPER FUSE COMBINED WITH ESD/OVER-VOLTAGE/REVERSE POLARITY PROTECTION

(75) Inventors: Olaf Pfennigstorf, Hamburg (DE); Wolfgang Schnitt, Seester (DE)

(73) Assignee: NXP, B.V., Eindhoven (NL)

( * ) Notice: Subject to any disclaimer, the term of this patent is extended or adjusted under 35 U.S.C. 154(b) by 56 days.

(21) Appl. No.: 13/216,328

(22) Filed: Aug. 24, 2011

(65) Prior Publication Data
US 2013/0050883 A1  Feb. 28, 2013

(51) Int. Cl.
*H02H 9/02* (2006.01)
*H01L 21/768* (2006.01)

(52) U.S. Cl.
USPC .......................................................... 361/54

(58) Field of Classification Search
USPC .......................................................... 361/54
See application file for complete search history.

(56) References Cited

U.S. PATENT DOCUMENTS

| 4,436,986 | A  | * | 3/1984  | Carlson  | 219/505 |
| 5,977,860 | A  | * | 11/1999 | Ulm et al. | 337/297 |
| 6,067,216 | A  | * | 5/2000  | Groger | 361/56 |
| 6,510,032 | B1 | * | 1/2003  | Whitney | 361/111 |
| 2007/0052063 | A1 | * | 3/2007 | Ueda | 257/529 |
| 2007/0057346 | A1 | * | 3/2007 | Lee et al. | 257/546 |
| 2008/0191832 | A1 | * | 8/2008 | Tsai | 337/297 |
| 2008/0206978 | A1 | * | 8/2008 | Hsu et al. | 438/601 |
| 2009/0224360 | A1 | * | 9/2009 | Kim | 257/529 |
| 2011/0148733 | A1 | * | 6/2011 | Fahs et al. | 343/859 |
| 2012/0013431 | A1 | * | 1/2012 | Blattler et al. | 337/297 |

FOREIGN PATENT DOCUMENTS

GB    2 312 105 A    10/1997

OTHER PUBLICATIONS

Extended European Search Report for European Patent Appln. No. 12179026.5 (Jul. 1, 2013).

* cited by examiner

*Primary Examiner* — Jared Fureman
*Assistant Examiner* — Kevin J Comber

(57) ABSTRACT

In one embodiment, an integrated circuit, and method of manufacturing thereof, is provided. The integrated circuit contains an over-voltage protection element and an over-current protection element. The integrated circuit operates to provide enhanced and efficient ESD functionality. The over-current element of the instant disclosure includes a diffusion protection layer to enhance the lifetime of the over-current element and improve functionality.

19 Claims, 4 Drawing Sheets

INTEGRATED ADVANCE COPPER FUSE COMBINED WITH ESD/OVER-VOLTAGE/REVERSE POLARITY PROTECTION

Melting fuses are used for protection of electronics against excess currents that could harm a powered device. These currents, known as over-currents, passed along as part of the current path within the fuse, will destroy or blow the melting fuse. The blown fuse will disconnect the current source and the electronics. In a typical situation, the fuse will be replaced after it is blown. The fuse protects the power source and the electronic equipment powered by the source. In the absence of a fuse, for example, a short in the powered equipment will cause the source to overload, and the source is likely damaged or destroyed. A malfunction of the power source, providing an excess current, will force the powered electronic equipment to withstand over-current, a current that the powered electronic equipment is not designed to withstand, and the powered electronic equipment is also damaged or destroyed.

An ideal fuse would have no resistance at all, would not degrade with lifetime, and would blow-up as soon as the specified maximum current is reached. In actuality, fuses in practice have an inner resistance, limited lifetime which is dependent on the working current through the fuse, and a time lag between the occurrence of the specified over-current, and the protection action (destruction) of the fuse. A typical specification for a fuse would define the minimum lifetime at a defined direct current flowing through the fuse, the time to blow up for another direct current, and the inner resistance of the fuse. Typically, fuses have built in a lag time such that the fuse will not be destroyed by a short pulse of high currents. Fuse design for such pulses are standardized, with the ranges from fractions of to several hundreds of microseconds. The lag time of the fuse, though it protects the fuse from being falsely destroyed, does not protect the powered device. During the lag time of the fuse, the powered device must withstand the over-voltage that accompanies the pulse.

Fuses protect against excess currents, but cannot protect against excess voltage. In order to protect a powered device against excess voltage, known as an over-voltage, additional protection is achieved by adding a surge device, such as a diode. A diode will limit the voltage at the input of a powered device to acceptable limits. A diode will direct a surging current to ground when the breakdown voltage of the diode is reached. Excessive current caused by excessive voltage will destroy the diode. The diode will commonly be a short (a low-ohmic connection) after destruction. Placing the diode between the power source and the fuse would endanger the power source. Therefore, in order to protect against over-current and over-voltage using a diode and a fuse, the diode has to be placed between the fuse and the device to be powered. In this placement, current flowing through the damaged (shorted) diode will blow up the fuse, and the current will stop flowing, protecting the power source from overload, and the powered device from the excessive current and excessive voltage.

With this placement, however, when the diode is shorted, the fuse and the diode must be replaced. When a fuse is blown, the diode has to be tested for integrity and replaced if the diode is damaged, or if a function test is not feasible, the diode is replaced in any instance. Testing the diode for feasibility each time a fuse is blown is time-consuming. Combining a diode and a fuse into one device allows for the enhanced performance of over-current and over-voltage protector, and allows for the quick and easy replacement of the powered-device protector.

In one embodiment, an integrated device includes both an over-current protection circuit and an over-voltage protection circuit. An integrated device including both elements improves functionality compared to a single fuse device or a single surge device. The combination of an over-current protection circuit and an over-voltage protection circuit operates to protect a powered device in an efficient manner.

During the lag time associated with a fuse, a surge diode will clamp the stress pulse to a safe level. The diode operates to protect the powered device during the lag time of the fuse. Integration of a fuse and diode will operate as a fast fuse, however, the problems associated with fast fuses, falsely blown by short high level pulses, will not be present. Further, the combination of a fuse and a diode will protect virtually immediately without a lag time because of the operation speed of a diode.

The over-current and over-voltage protection circuits are packaged in the same device such as an integrated circuit. A conductive layer of the integrated circuit operates to pass a power-based signal from a power source to a powered device. Metal is susceptible to oxidation, which degrades the metal. Therefore, the conductive material of the instant disclosure is provided with a diffusion-protector. The diffusion-protector enhances operation of the integrated circuit by increasing the lifetime of the conductive material.

The above discussion is not intended to describe each embodiment or every implementation. The figures and following description also exemplify various embodiments.

Various example embodiments may be more completely understood in consideration of the following detailed description in connection with the accompanying drawings, in which.

Figure 1:
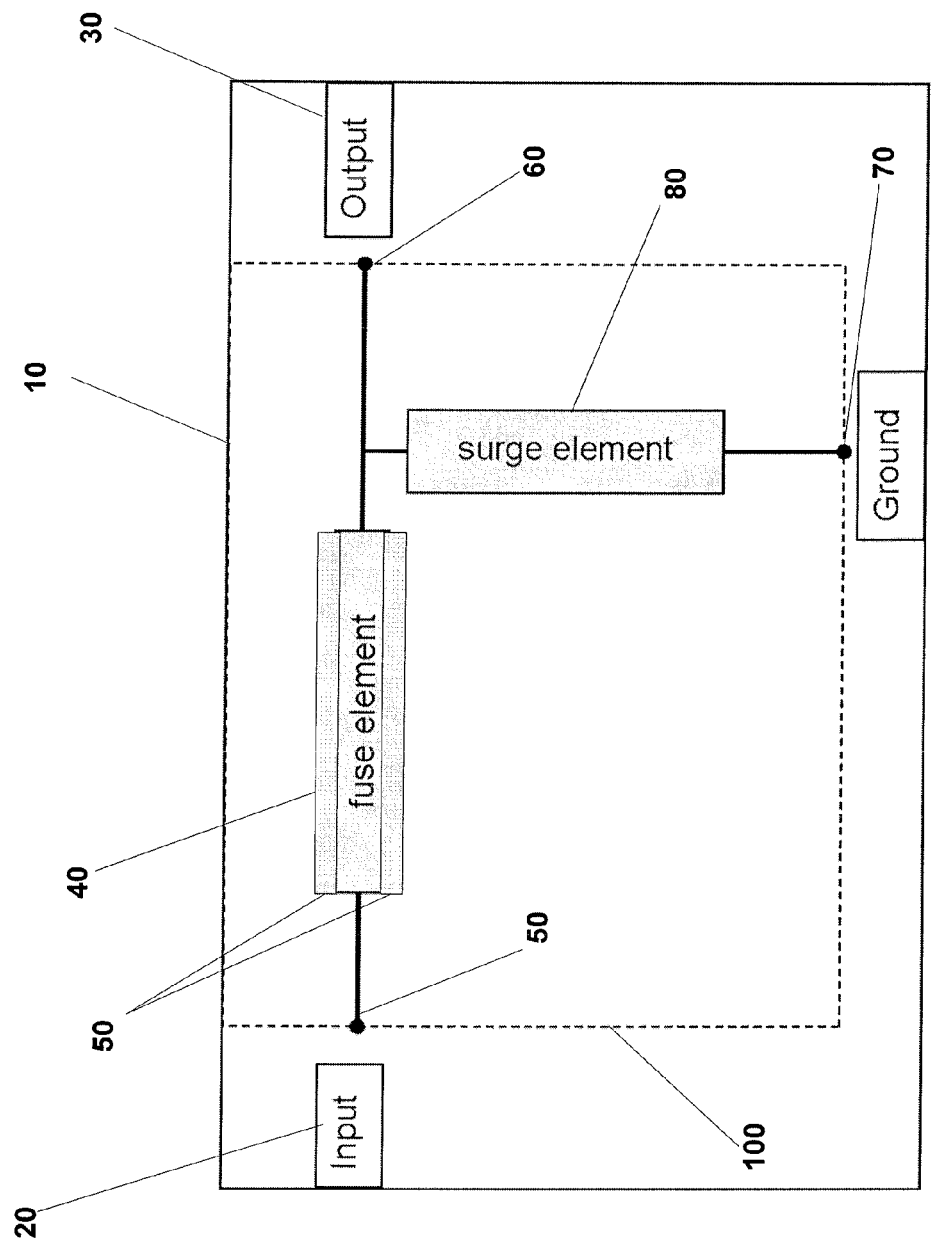
FIG. 1 shows an example embodiment of an integrated circuit containing a fuse-element and a surge element.

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

The integrated circuit of the instant disclosure operates to protect against both over-voltage and over-current of a power signal passed through the integrated circuit to an output device. In one example embodiment, the integrated circuit includes a supportive-foundation block, such as a substrate for the various other components. As a part of the integrated circuit, a conductive structure, such as a metal track or conductor, is provided with a diffusion-protector, which borders the conductive structure. In a more specific embodiment, the metal track is primarily a copper material. The metal track of the conductive structure is susceptible to diffusion or eroding of the metal when oxidized. The diffusion protector is designed to protect the metal track to lessen the oxidation and thus eroding of the metal.

The metal track of the integrated circuit electrically connects an input terminal and an output terminal. The input terminal is connected to the power source of an input device, and passes the power signal to the metal track. The metal track passes the signal to the output terminal. The output terminal is connected to a device that is to be powered. A third terminal, used as a reference terminal, is connected to the metal track by a voltage surge circuit for passing power surges to a common ground reference node.

In the case of the power-based signal exceeding a threshold current, the metal track is sacrificed due to excessive temperatures, thus destroying the metal track. This metal track is designed to be destroyed to protect the target device (i.e., the device to be powered such as connected to the output terminal) from an over-voltage that would harm the device.

In the case that the power-based signal exceeds a voltage-threshold level associated with the current, the voltage-surge circuit will either short the signal to the reference terminal or block the signal with the metal track. This shorting or blocking protects the device to be powered from harmful over-voltage.

In an example embodiment, the integrated circuit is manufactured to protect the metal layer against diffusion. A suitable semiconductor substrate can be used as a base for building the integrated circuit. The substrate can be of a variety of materials depending on the specific application. A first layer of diffusion protector is deposited on the semiconductor substrate. Following the deposition of a first layer of diffusion protector, a layer of metal is deposited on the first layer of diffusion protector. The metal layer covers the first layer of diffusion protector. A second layer of diffusion protector is deposited on the layer of metal. The second layer of diffusion protector covers the entire metal layer. Using standard (e.g., lithography) practices, an etch mask is provided on the combined three layers deposited on the substrate. Using the etch mask, the three layers are etched to expose the sides of the metal layer, while keeping both the bottom and top of the metal layer covered by the diffusion protector. In this manner, the top and bottom of the metal layer are protected against oxygen, which increases the lifetime of the metal.

Turning now to the figures, FIG. 1 depicts an integrated circuit which protects against over-voltage and over-current, which is largely consistent with aspects of the above-type integrated circuit.

In an example embodiment shown in FIG. 1, the integrated circuit 10 protects against various discrepancies of an input power signal 20, which is passed through the integrated circuit 10, to an output power signal 30. An example of such discrepancies of the input power signal 20 could include a voltage exceeding a threshold level associated with the integrated circuit 10, a current exceeding a current threshold value associated with the integrated circuit 10, or signal containing both excessive voltage and excessive current. In one example embodiment, the integrated circuit 10 includes a supportive-foundation block 100. In specific embodiments, the supportive-foundation block 100 could be a semiconductor substrate. The supportive-foundation block 100 provides a base for the various other components.

As a part of the integrated circuit 10, a fuse element 40 is provided with a diffusion-protector 50. In specific embodiments, the fuse element 40 is a conductive structure, such as a metal track or is a similar conductive type material. In a more specific embodiment, the fuse element 40 is primarily a copper material. The diffusion-protector 50 surrounds the fuse element 40 to protect against erosion of the fuse element 40 due to oxidation. Conductive materials are susceptible to degradation due to the exposure of oxygen (e.g., oxidation). Oxidation or degradation of the conductive material could lessen the lifetime of the conductive material and alter the operating range and effectiveness. The fuse element 40 of the integrated circuit 10 electrically connects an input terminal 50 and an output terminal 60.

The input terminal 50 passes a power signal to the fuse element 40. The fuse element 40, being a conductive material, passes the signal to the output terminal 60. A reference terminal 70, a third terminal of the integrated circuit 10, is connected to the fuse element 40 by a surge element 80. The surge element 80 operates by passing power surges to the reference terminal 70. In a specific embodiment, the reference terminal 70 operates as a common ground.

Figure 2:
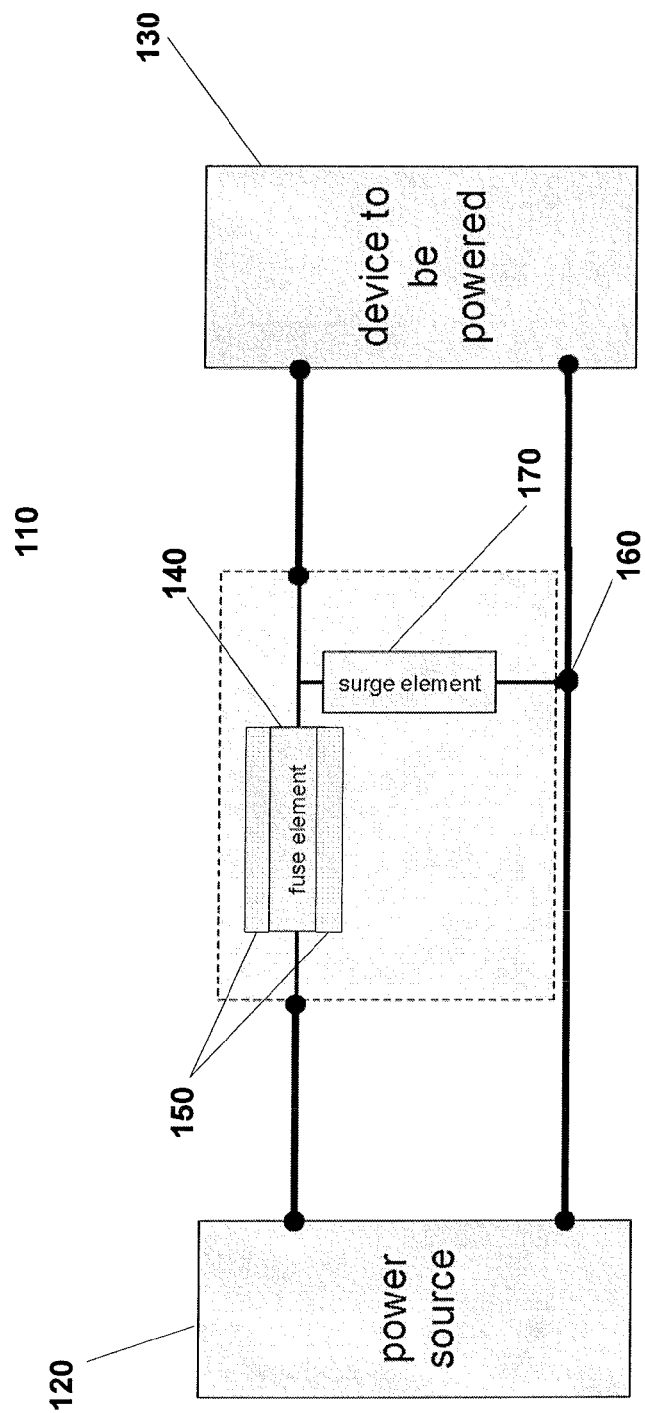
FIG. 2 shows another example embodiment of an integrated circuit connected to a power source and a powered device.

Referring now to FIG. 2, which shows an integrated circuit 110 connected to a power source 120 and a powered device 130. The fuse element 140 passes a power signal from the power source 120 to the powered device 130. As a part of the integrated circuit 110, the fuse element 140 is a conductive structure, which is provided with a diffusion-protector 150. In specific embodiments, the fuse element 140 is a metal track or is a similar conductive type material. In a more specific embodiment, the fuse element 140 is primarily a copper material. The diffusion-protector 150 surrounds the fuse element 140 to protect against erosion of the fuse element 140 due to oxidation. Conductive materials are susceptible to degradation due to the exposure of oxygen (e.g., oxidation). Oxidation or degradation of the conductive material could lessen the lifetime of the conductive material and alter the operating range and effectiveness. The fuse element 140 of the integrated circuit 110 electrically connects the power source 120 to the device to be powered 130. A reference terminal 160 is the third terminal of the integrated circuit 110, and is connected to the fuse element 140 by a surge element 170. The surge element 170 (e.g., a diode) passes a power surge that would harm the powered device 130 to the reference terminal 160, thus avoiding harm to the powered device 130.

If the power source 120 provides a power-based signal having a current that exceeds a threshold current associated with the integrated circuit 110, the fuse element 140 is sacrificed due to excessive temperatures. In an example embodiment, the fuse element 140 is a metal track. The metal track will be destroyed by excessive temperatures, and an excessive current will not be passed to the powered device 130. Upon destroying the metal track of the fuse element 140, the power source 120 will no longer be electrically connected to the powered device 130.

It is possible that the power source 120 will supply a power-based signal that exceeds a voltage-threshold level associated with the integrated circuit 110. If this occurs, the surge device 170 will either short the signal to the reference terminal 160, or block the signal with the fuse element 140. The shorting or blocking protects the device to be powered from harmful over-voltages.

In an example embodiment, the fuse element, a metal track, is located on the top of a semiconductor die. A metal track can be made with a low resistance. Metals common to semiconductor technology can be used for the metal track (e.g. aluminum, gold, platinum or copper). Aluminum has the disadvantage of being prone to electromigration effects. Gold and platinum are expensive and not very common. Copper can be used because it is not prone to electromigration and it is low ohmic. The integrated circuit has three contact areas for external contacting, a conductive track (e.g. copper), and a diode. The first contact connected to one end of the conductive track, the second contact connected to the other end of the conductive track, and to one end of the diode. The third contact connects to the other end of the diode.

In another example embodiment, the fuse element is thermally isolated from the substrate. Thermally separating the fuse element from the substrate, by enveloping the metal track of the fuse element in dielectrics, sustains the defined failure current of the metal track. The power needed for heating the track locally to its melting temperature would be higher if the metal track is not thermally isolated. For a defined failure current, this would mean higher resistance would be necessary. Low resistivity of the fuse is desired, therefore, thermally isolating the fuse element from the substrate aids in the operation of the device.

In a specific embodiment, the conductive track is a copper track. The copper track has a portion of minimal width. The minimal width portion is destroyed when an over-current associated with the integrated circuit is forced through the track. The minimal width potion can be 50-200 μm in width, with a corresponding metal thickness of around 1-2 μm. This thickness allows for a continuous working current of 2 Amperes, in this case, and an over-current value of 5 Amperes, for example.

Figure 3:
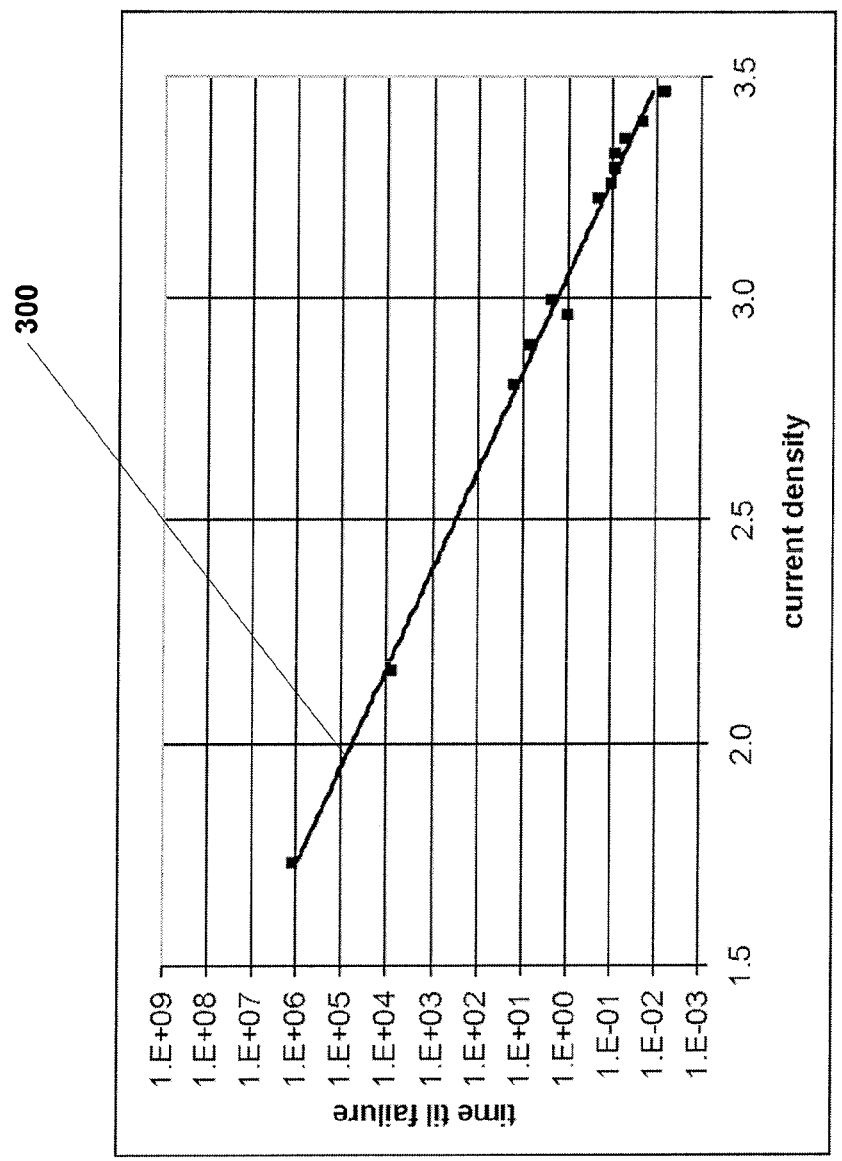
FIG. 3 shows the lifetime of a conductive material, and the failure based on the current density.

Copper easily reacts with oxygen especially at raised temperatures (approximately 200° C.). These raised temperatures are obtained under normal operation conditions (e.g., 2 Amperes direct current; and several mOhm inner resistance). Turning to FIG. 3, physical analysis shows that the lifetime of the copper track, at moderate current levels, is limited by oxidation of the copper. The curve 300 shows the lifetime of the metal track. The lifetime of the fuse should be high while the time until failure for high currents should be low. The slope associated with the failure curve shown in FIG. 3 should be higher. Oxidation reduces the thickness of the copper layer significantly. The oxidation, in turn, increases the resistance of the layer which causes more heat generation, and increases the speed of oxidation. The thickness of the metal track is limited by the semiconductor process, making a thicker layer not feasible. Protection of the metal track is important to increase the lifetime of the metal track.

Figure 4:
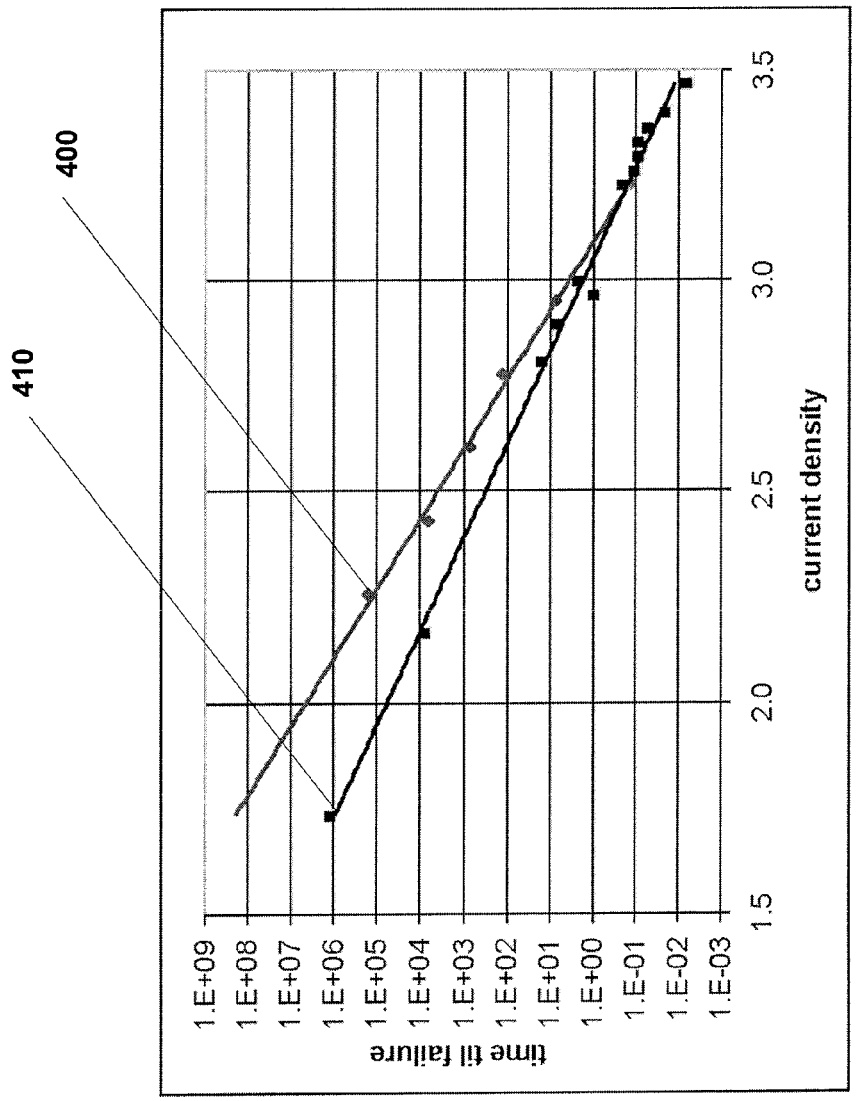
FIG. 4 shows the lifetime of a conductive material of an example embodiment plotted against the lifetime of a typical conductive material.

In an example embodiment, the metal track is sandwiched between two thin layers of metal (e.g., TiN). The metal layers sandwiching the metal track are designed to stop diffusion of oxygen (oxidation) to the surface of the copper. As seen in FIG. 4, the upper curve 400, having the metal layers designed to stop diffusion, has a higher slope than the lower curve 410. The metal layers greatly increase the lifetime of the metal track.

In a specific embodiment, the supportive-foundation block is formed of silicon with n-p-junction. Two external contacts are on top of the silicon die, and a copper track connects the two external contacts. A third contact, a ground, is placed either on top of the silicon die or at the back of the silicon die. A diode connects to the second of the external contacts and to the ground contact. The copper track is separated from the top of the silicon die by a dielectric. The dielectric (e.g., a polymer) is approximately 3 μm thick. The copper track is also sandwiched by two layers of a diffusion protector (e.g., TiN). The resulting structure is a silicon die assembled in a package with three contacts.

In other example embodiments, the integrated circuit is assembled as a chip scale package with at least three bumps on top of a silicon die and/or includes target circuitry to be powered by the protective circuitry. The fuse element is an under-bump metal. The under-bump metal includes an aluminum layer at the bottom, a copper layer at the top, and one or more diffusion protective layers in between. The top copper layer is covered with a thin layer of TiN.

Based upon the above discussion and illustrations, those skilled in the art will readily recognize that various modifications and changes may be made without strictly following the exemplary embodiments and applications illustrated and described herein. Furthermore, various features of the different embodiments may be implemented in various combinations. Such modifications do not depart from the true spirit and scope of the present disclosure, including those set forth in the following claims.

What is claimed is:

1. An integrated circuit including a circuit-building substrate, the integrated circuit comprising:
   a conductive structure, supported by the circuit-building substrate, including a metal track, and a diffusion-protector configured and arranged to lessen diffusion relative to the structure of the metal track, wherein the metal track is surrounded by and in contact with a first layer and a second layer of the diffusion-protector, wherein the first layer is deposited on the circuit-building substrate, the metal track covers the first layer, and the second layer covers the metal track;
   an input terminal configured and arranged to present an input power-based signal to a first portion of the metal track;
   an output terminal configured and arranged to pass an output power-based signal ensuing from the input power-based signal, to a second portion of the metal track; and
   a voltage-surge circuit configured and arranged to pass the output power-based signal to a reference terminal in response to a voltage of the output power-based signal exceeding a voltage-threshold level associated with the circuit, whereby in response to a voltage surge exceeding the voltage-threshold level, the voltage-surge circuit is adapted to limit voltage levels supplied to electric circuitry connected at the output terminal by either shorting via the reference terminal or blocking with the metal track adapted to be sacrificed for over-current protection.

2. The integrated circuit of claim 1, further including a circuit connected at the output terminal and cooperatively configured and arranged with the conductive structure and the voltage-surge circuit to be protected from over-voltage and over-current conditions, and wherein the diffusion-protector is further configured and arranged to mitigate oxidation of the metal track.

3. The integrated circuit of claim 1, wherein the voltage-surge circuit provides a low-ohmic connection to the reference terminal.

4. The integrated circuit of claim 1, wherein the metal track is copper.

5. The integrated circuit of claim 1, wherein the metal track has a width between 50 and 200 micrometers.

6. The integrated circuit of claim 1, wherein the metal track has a thickness of 1-2 micrometers.

7. The integrated circuit of claim 1, wherein the metal track is adapted to operate a continuous working current that is not less than 2 Amps, and is adapted to be sacrificed at a current that is not greater than 5 Amps.

8. The integrated circuit of claim 1, wherein the metal track is separated from the circuit-building substrate by a layer of isolating dielectric.

9. The integrated circuit of claim 1, wherein the diffusion-protector includes TiN or TiWN located on opposite sides of the metal track.

10. The integrated circuit of claim 1, wherein the voltage-surge circuit includes a p-n junction.

11. The integrated circuit of claim 1, wherein the voltage-surge circuit includes a diode.

12. The integrated circuit of claim 1, wherein the metal track is configured and arranged to connect the input terminal at one end of the metal track, and the output terminal at the opposite end of the metal track.

13. An integrated circuit including a circuit-building substrate, the integrated circuit comprising:
a conductive structure, supported by the circuit-building substrate, including a metal track, and a diffusion-protector configured and arranged to lessen diffusion relative to the structure of the metal track and to mitigate oxidation of the metal track, wherein the metal track is surrounded by and in contact with a first layer and a second layer of the diffusion-protector, wherein the first layer is deposited on the circuit-building substrate, the metal track covers the first layer, and the second layer covers the metal track;
an input terminal configured and arranged to present an input power-based signal to a first portion of the metal track;
an output terminal configured and arranged to pass an output power-based signal, ensuing from the input power-based signal, to a second portion of the metal track; and
a low-ohmic voltage-protection device configured and arranged to pass the output power-based signal to a reference terminal, in response to a voltage of the output power-based signal exceeding a voltage-threshold level associated with the circuit, wherein in response to a power-related signal at the input terminal presenting a voltage surge exceeding the voltage-threshold level and an over-current condition, the low-ohmic voltage-protection device is adapted to limit voltage levels supplied to electric circuitry connected at the output terminal by either shorting via the reference terminal or blocking while the metal track is heated in response to the over-current condition and then is sacrificed for over-current protection.

14. The integrated circuit of claim 13, wherein the metal track is configured and arranged to withstand temperatures up to 200 degrees Centigrade.

15. The integrated circuit of claim 13, wherein the metal track includes a first metal composition, and the diffusion-protector includes a second metal composition.

16. The integrated circuit of claim 13, wherein the diffusion-protector is a thin layer of TiN or TiWN.

17. The integrated circuit of claim 13, wherein the metal track is separated from the circuit-building substrate by a layer of isolating dielectric.

18. A method of manufacturing an integrated circuit including a circuit-building substrate, the integrated circuit comprising:

a conductive structure, supported by the circuit-building substrate, including a metal track, and a diffusion-protector configured and arranged to lessen diffusion relative to the structure of the metal track, wherein the metal track is surrounded by and in contact with a first layer and a second layer of the diffusion-protector, wherein the first layer is deposited on the circuit-building substrate, the metal track covers the first layer, and the second layer covers the metal track;
an input terminal configured and arranged to present an input power-based signal to a first portion of the metal track;
an output terminal configured and arranged to pass an output power-based signal ensuing from the input power-based signal, to a second portion of the metal track; and
a voltage-surge circuit configured and arranged to pass the output power-based signal to a reference terminal in response to a voltage of the output power-based signal exceeding a voltage-threshold level associated with the circuit, whereby in response to a voltage surge exceeding the voltage-threshold level, the voltage-surge circuit is adapted to limit voltage levels supplied to electric circuitry connected at the output terminal by either shorting via the reference terminal or blocking with the metal track adapted to be sacrificed for over-current protection, the method comprising:
providing the substrate;
depositing the first layer of diffusion-protector on the substrate;
depositing the metal track on the first layer of diffusion-protector, the first layer of the diffusion-protector contacting the bottom side of the metal track;
depositing the second layer of diffusion-protector on the metal track, the second layer of diffusion-protector contacting the top side of the metal track;
providing an etch mask using lithography over the first layer of diffusion-protector, the metal track, and the second layer of diffusion-protector; and
etching the first layer of diffusion-protector, the metal track, and the second layer of diffusion-protector using lithography to expose the edges of the metal track and retain a portion of the first layer of diffusion protector on the bottom of the metal track, and portion of the second layer of diffusion protector the top of the metal track.

19. The method of claim 18, wherein the first layer of diffusion-protector and the second layer of diffusion-protector include a barrier metal.

* * * * *